(12) United States Patent
Im et al.

(10) Patent No.: US 11,114,774 B2
(45) Date of Patent: Sep. 7, 2021

(54) DISPLAY DEVICE AND MANUFACTURING METHOD THEREOF

(71) Applicant: SAMSUNG DISPLAY CO., LTD., Yongin-si (KR)

(72) Inventors: Dae Hyuk Im, Daegu (KR); Byoung Yong Kim, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 14 days.

(21) Appl. No.: 16/689,240

(22) Filed: Nov. 20, 2019

(65) Prior Publication Data

US 2020/0194906 A1 Jun. 18, 2020

(30) Foreign Application Priority Data

Dec. 12, 2018 (KR) .................. 10-2018-0160209

(51) Int. Cl.
| | | |
|---|---|---|
| H01R 4/04 | (2006.01) | |
| H05K 1/18 | (2006.01) | |
| H01R 43/00 | (2006.01) | |
| H05K 3/32 | (2006.01) | |

(52) U.S. Cl.
CPC .............. *H01R 4/04* (2013.01); *H01R 43/00* (2013.01); *H05K 1/189* (2013.01); *H05K 3/323* (2013.01); *H05K 2201/0269* (2013.01); *H05K 2201/0329* (2013.01); *H05K 2201/10128* (2013.01); *H05K 2203/107* (2013.01); *H05K 2203/1136* (2013.01)

(58) Field of Classification Search
CPC .......... H01R 4/04; H05K 1/189; H05K 3/323; H05K 2201/0329; H05K 2201/10128; H05K 3/361; H05K 3/321

USPC .......................................... 361/751
See application file for complete search history.

(56) References Cited

U.S. PATENT DOCUMENTS

| | | | | |
|---|---|---|---|---|
| 5,592,365 | A * | 1/1997 | Sugimoto .............. | H05K 3/323 361/789 |
| 2006/0251871 | A1* | 11/2006 | Masuda ............... | H01R 43/007 428/209 |
| 2013/0092426 | A1* | 4/2013 | Wu ......................... | C09J 7/385 174/257 |
| 2013/0306943 | A1 | 11/2013 | Kato et al. | |

(Continued)

FOREIGN PATENT DOCUMENTS

| | | |
|---|---|---|
| EP | 2623574 | 8/2013 |
| KR | 10-0418031 | 1/2004 |

(Continued)

*Primary Examiner* — Sherman Ng
(74) *Attorney, Agent, or Firm* — F. Chau & Associates, LLC (57) ABSTRACT

A display device includes a display panel. A flexible printed circuit board is electrically connected to the display panel. A first pad is disposed on the display panel. A second pad is disposed on the flexible printed circuit board and overlaps the first pad. A first anisotropic conductive film is disposed between the first pad and the second pad. The first anisotropic conductive film is configured to bond the first pad to the second pad. The first anisotropic conductive film includes a conductive polymer. The first anisotropic conductive film includes at least one first conductive region that electrically connects the first pad and the second pad and at least one first insulating region.

19 Claims, 6 Drawing Sheets

(56) References Cited

U.S. PATENT DOCUMENTS

| | | | | |
|---|---|---|---|---|
| 2014/0254119 | A1* | 9/2014 | Im | C09J 7/22 |
| | | | | 361/767 |
| 2016/0100481 | A1* | 4/2016 | Kim | H01B 1/20 |
| | | | | 174/251 |
| 2016/0219706 | A1* | 7/2016 | Jo | H05K 3/361 |
| 2017/0338198 | A1* | 11/2017 | Jang | H01L 24/29 |
| 2018/0088388 | A1* | 3/2018 | Furuta | G02F 1/13452 |

FOREIGN PATENT DOCUMENTS

| | | |
|---|---|---|
| KR | 10-0671312 | 1/2007 |
| KR | 10-0867587 | 11/2008 |
| KR | 10-1488628 | 1/2015 |
| KR | 10-1748033 | 6/2017 |
| KR | 10-1753845 | 6/2017 |

\* cited by examiner

DISPLAY DEVICE AND MANUFACTURING METHOD THEREOF

CROSS-REFERENCE TO RELATED APPLICATION

This application claims priority under 35 U.S.C. § 119 to Korean Patent Application No. 10-2018-0160209, filed in the Korean Intellectual Property Office on Dec. 12, 2018, the disclosure of which is incorporated by reference in its entirety herein.

1. TECHNICAL FIELD

The present disclosure relates to a display device and a manufacturing method thereof.

2. DISCUSSION OF RELATED ART

Display devices such as organic light emitting diode displays and liquid crystal displays are used in a wide variety of electronic devices. A display device includes a display panel which includes pixels for displaying an image. In addition to the pixels, a driver and a pad portion for inputting and outputting signals used for controlling the pixels may be disposed in the display panel. The display panel may also include an integrated circuit (IC) chip or a chip-like flexible printed circuit board (FPCB) that is bonded to the pad portion.

An anisotropic conductive film (ACF) which includes conductive balls may be used for physically coupling the FPCB to the electrical connection of the pad portion. When the display device has an increased resolution and the circuits are integrated, a distance between the pads is gradually narrowed. Therefore, the electrical connection of the pads needs to have improved reliability.

In the bonding process of the anisotropic conductive film including the conductive balls, the conductive balls may not be uniformly captured in all regions of the pad portion by a resin flow. When the conductive balls are excessively concentrated in some regions, adjacent pads in the surface direction may be short-circuited. Additionally, when the conductive balls are insufficient in some regions, facing pads may not be electrically connected. Furthermore, a pitch and area of the pads may be restricted in order to electrically connect facing pads to each other by using conductive balls which have a certain size and volume and are irregularly disposed, and to simultaneously prevent adjacent pads from being electrically connected. For example, when the distance between the pads is closer than a certain level, adjacent pads may be short-circuited. When the pad area is insufficient, facing pads may not be electrically connected to each other. This can be especially problematic in high resolution display devices where a large number of pads are needed to be integrated in a certain area.

SUMMARY

In an exemplary embodiment of the present inventive concepts, a display device includes a display panel. A flexible printed circuit board is electrically connected to the display panel. A first pad is disposed on the display panel. A second pad is disposed on the flexible printed circuit board and overlaps the first pad. A first anisotropic conductive film is disposed between the first pad and the second pad. The first anisotropic conductive film is configured to bond the first pad to the second pad. The first anisotropic conductive film includes a conductive polymer. The first anisotropic conductive film includes at least one first conductive region that electrically connects the first pad and the second pad and at least one first insulating region.

The first conductive region may be disposed in a region where the first pad and the second pad overlap, and the first insulating region may be disposed in a region surrounding the first conductive region.

The conductive polymer may include at least one among polyacetylene, polypyrrole, polythiophene, polyphenylene vinylene, and polyphenylene.

The first conductive region may include trans-polyacetylene, and the first insulating region may include cis-polyacetylene.

The first pad may have a fine pitch, and the pitch of the first pad may be 27 μm or less.

The display device may further include a printed circuit board, a third pad disposed on the flexible printed circuit board, and a fourth pad disposed on the printed circuit board.

The display device may further include a second anisotropic conductive film disposed between the third pad and the fourth pad, the second anisotropic conductive film configured to bond the third pad to the fourth pad.

The second anisotropic conductive film may include a conductive polymer.

The second anisotropic conductive film may include a second conductive region configured to electrically connect the third pad and the fourth pad and a second insulating region, and the second conductive region may be disposed in a region where the third pad and the fourth pad overlap.

The flexible printed circuit board may include a data driver integrated circuit.

The data driving integrated circuit may transmit a signal to the display panel through the second pad, the first anisotropic conductive film, and the first pad.

In an exemplary embodiment of the present inventive concepts, a display device includes a display panel. A flexible printed circuit board is electrically connected to the display panel. A first pad is disposed on the display panel. A second pad is disposed on the flexible printed circuit board and overlaps the first pad. A first anisotropic conductive film is disposed between the first pad and the second pad. The first anisotropic conductive film is configured to bond the first pad to the second pad. The first anisotropic conductive film includes at least one first conductive region that is configured to electrically connect the first pad to the second pad and at least one first insulating region. At least one first conductive region includes a polysilicon. The at least one insulating region includes an amorphous silicon.

In an The first conductive region may be disposed in a region where the first pad and the second pad overlap, and the first insulating region may be disposed in a region surrounding the first conductive region.

The first anisotropic conductive film may further include a thermosetting resin or a photocurable resin.

The display device may further include a printed circuit board, a third pad disposed on the flexible printed circuit board, a fourth pad disposed on the printed circuit board, and a second anisotropic conductive film disposed between the third pad and the fourth pad.

The second anisotropic conductive film may include a second conductive region that is configured to electrically connect the third pad to the fourth pad and a second insulating region, the second conductive region includes a polysilicon, and the second insulating region may include an amorphous silicon.

The second anisotropic conductive film may further include a thermosetting resin or a photocurable resin.

Exemplary embodiment of the present inventive concepts, a manufacturing method of a display device includes providing a display panel and a flexible printed circuit board. An anisotropic conductive film is attached to the display panel or the flexible printed circuit board. A mask is provided on the anisotropic conductive film. The mask includes an opening in an area corresponding to a pad of the display panel or a pad of the flexible printed circuit board. A laser is irradiated onto the anisotropic conductive film through the opening of the mask onto a region of the anisotropic conductive film that overlaps the pad of the display panel or the pad of the flexible printed circuit board to form at least one conductive region in a region that was irradiated and at least one insulating region in a region that was not irradiated.

The exemplary embodiments include a structure capable of electrical connection between the pads without including conductive balls. Accordingly, there is no limitation on a pitch or an area of the pads depending on density, size, etc. of the conductive balls, and connection reliability of the pads may be improved because there is no problem of short-circuit or opening by the conductive balls. In addition, since pads permit a minute pitch and area to be formed, it is possible to reduce a dead space disposed around a region where an image is displayed in the display device, and to realize high resolution of the display device, whereby design freedom of the display device may be increased.

The anisotropic conductive film may include a conductive polymer.

DETAILED DESCRIPTION OF THE EXEMPLARY EMBODIMENTS

The present invention will be described more fully hereinafter with reference to the accompanying drawings, in which exemplary embodiments of the present inventive concepts are shown. As those skilled in the art would realize, the described exemplary embodiments may be modified in various different ways, all without departing from the spirit or scope of the present inventive concepts.

To clearly describe the present inventive concepts, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present inventive concepts are not limited to the illustrated sizes and thicknesses. For example, in the drawings, the thicknesses of layers, films, panels, regions, etc., may be exaggerated for clarity. In the drawings, for better understanding and ease of description, the thicknesses of some layers and areas may be exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, and does not necessarily mean positioning on the upper side of the object portion based on a gravity direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

Figure 1:
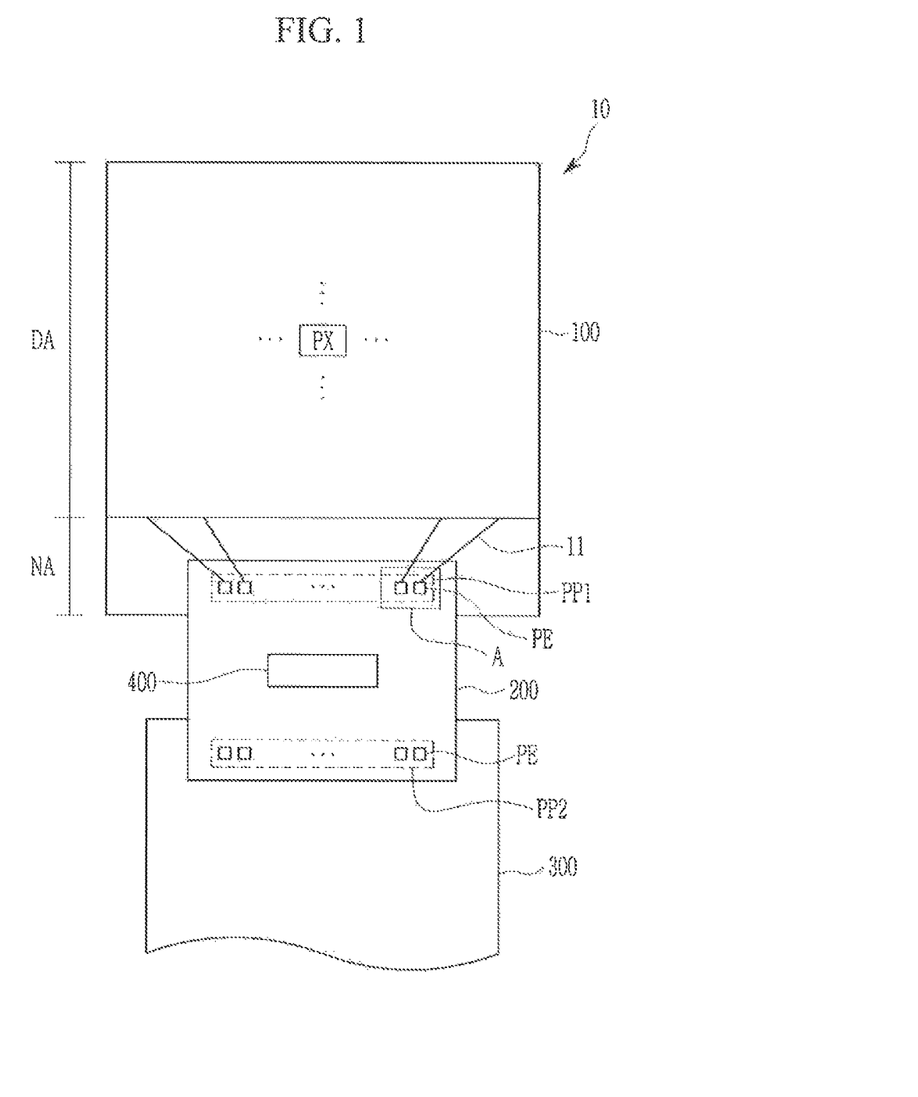
FIG. 1 is a block diagram schematically illustrating a display device according to an exemplary embodiment of the present inventive concepts.

Hereinafter, a display device according to an exemplary embodiment of the present inventive concepts will be described with reference to FIG. 1 to FIG. 3. FIG. 1 schematically illustrates a display device 10 according to an exemplary embodiment of the present inventive concepts.

Referring to FIG. 1, according to an exemplary embodiment of the present inventive concepts, the display device 10 may include a display panel 100, a flexible printed circuit board 200 connected to the display panel 100, and a printed circuit board (PCB) 300 connected to the flexible printed circuit board 200. In an exemplary embodiment, the display panel 100 may be an organic light emitting diode display panel, a liquid crystal panel or another display panel known in the art.

The display panel 100 may include a display area DA for displaying an image, and a non-display area NA in which elements and wires for generating and transferring various signals applied to the display area DA may be disposed. The non-display area NA may be disposed at the outer circumference of the display area DA. Although a side-edge region, e.g., a lower region, of the display panel 100 is illustrated as the non-display area NA in FIG. 1, other side-edge regions, e.g., left, right, and/or upper edge regions, may correspond to the non-display area NA, and may be disposed in an area surrounding the display area DA. Although the display area DA is illustrated as a quadrangle, the display area may have various shapes such as a circle, an ellipse, and a polygon in addition to the quadrangle.

Pixels PX may be disposed in the display area DA of the display panel 100. The pixels PX may be disposed in matrix form. Signal lines such as gate lines and data lines may also be arranged in the display area. The gate lines may extend in a substantially row direction (e.g., horizontal direction), and the data lines may extend in a substantially column direction (e.g., vertical direction). Each pixel PX may be connected to a gate line and a data line to receive a gate signal and a data signal from these signal lines.

A first pad portion PP1 including pads PE for receiving signals from the outside of the display panel 100 may be disposed in the non-display area NA of the display panel 100. A plurality of signal lines 11 disposed in the display area may extend to the non-display area NA to be connected with the pads PE of the first pad portion PP1. In an exemplary embodiment, a gate driver may be integrated in the non-display area NA of the display panel 100, and may be provided in the form of an integrated circuit chip.

The flexible printed circuit board 200 may be bent, and a first end of the flexible printed circuit board 200 may be electrically connected to the signal lines 11 of the display panel 100. The first end of the flexible printed circuit board 200 may overlap the first pad portion PP1 of the display panel 100, and the flexible printed circuit board 200 and the display panel 100 may be electrically connected with each other in the first pad portion PP1. As will be described later, the display panel 100 and the flexible printed circuit board 200 may be connected by an anisotropic conductive film to receive signals from the flexible printed circuit board 200.

The flexible printed circuit board 200 may include a data driver integrated circuit 400 for generating a data voltage that is a gray voltage corresponding to an input video signal. The data driver integrated circuit 400 may be mounted on the flexible printed circuit board 200 and may be connected to the first pad portion PP1 in the form of a tape carrier package. However, in alternative embodiments, the data driver may be mounted on different portions of the display device, such as on the non-display area NA of the display panel between the display area DA and the first pad portion PP1 in the form of an integrated circuit chip.

A second pad portion PP2 including pads PE for receiving signals may be disposed on a second end of the flexible printed circuit board 200. A first end of the printed circuit board 300 may be connected to the second pad portion PP2 of the flexible printed circuit board 200. In an exemplary embodiment, the flexible printed circuit board 200 and the printed circuit board 300 may be electrically connected by an anisotropic conductive film.

The printed circuit board 300 may include a signal controller for controlling the gate driver of the display panel 100. The signal controller may be disposed on the printed circuit board 300 to transmit signals to the display panel 100 through the flexible printed circuit board 200.

Figure 2:
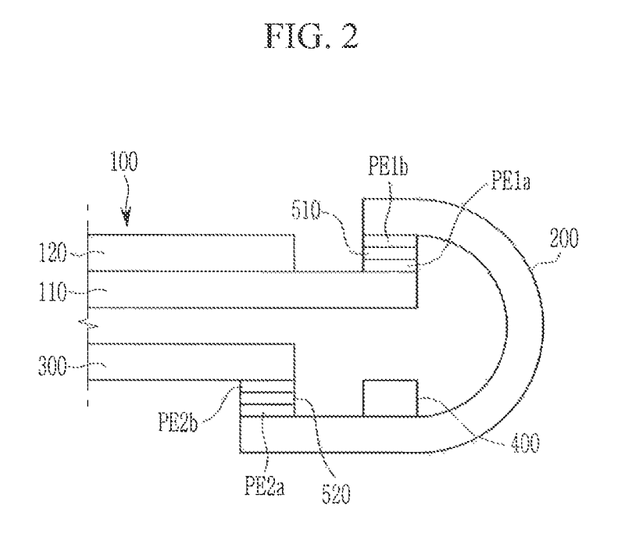
FIG. 2 illustrates a cross-sectional view of a display device according to an exemplary embodiment of the present inventive concepts.

FIG. 2 illustrates a cross-sectional view of a display device according to an exemplary embodiment of the present inventive concepts. FIG. 2 specifically illustrates the cross-sectional view of the display device in which the flexible printed circuit board 200 is bent.

As described above, the display device includes the display panel 100, the flexible printed circuit board 200, and the printed circuit board 300.

The display panel 100 may include a substrate 110. The substrate 110 may include a flexible material such as plastic that can be curved, bent, folded, or curled.

A thin film transistor display panel 120 and a first pad PE1a may be disposed on the substrate 110. For example, in the exemplary embodiment shown in FIG. 3, the first pad PE1a comprises three rectangular pads that are spaced apart from each other. However, the number of pads and the shape of pads are not limited thereto. The thin film transistor display panel 120 may be disposed in the display area DA of FIG. 1. The thin film transistor display panel 120 may include at least one thin film transistor, and a plurality of signal lines including a plurality of gate lines, a plurality of data lines, and a plurality of driving voltage lines.

In an exemplary embodiment, the first pad PE1a may be disposed at an edge of the substrate 110, and may be disposed in the non-display area NA. A plurality of signal lines disposed in the thin film transistor display panel 120 may extend to the non-display area NA to be connected to the first pad PE1a.

The flexible printed circuit board 200 may include the data driver integrated circuit 400, a second pad PE1b, and a third pad PE2a. The flexible printed circuit board 200 may be bent downwardly of the substrate 110. In other words, the flexible printed circuit board 200 may be bent in a direction toward a surface of the substrate 110, opposite to a surface thereof where the thin film transistor array panel 120 is disposed.

The data driver integrated circuit 400 may be disposed on a lower surface of the flexible printed circuit board 200 before bending, and may be disposed below the substrate 110 of the display panel 100 after the flexible printed circuit substrate 200 is bent. The data driver integrated circuit 400 may be electrically connected to the first pad PE1a and the second pad PE1b.

The second pad PE1b may be disposed on the first end of the flexible printed circuit board 200, and may be electrically connected to the first pad PE1a of the display panel 100 by a first anisotropic conductive film 510. The first anisotropic conductive film 510 may have a first surface that is in contact with the first pad PE1a and a second surface that is in contact with the second pad PE1b. The first anisotropic conductive film 510 may bond the first pad PE1a of the display panel 100 and the second pad PE1b of the flexible printed circuit board 200, and may electrically connect them at the same time.

A third pad PE2a is disposed on a second end of the flexible printed circuit board 200, and may be electrically connected to a fourth pad PE2b of the display panel 300 by a second anisotropic conductive film 520. The second anisotropic conductive film 520 may have a first surface that is in contact with the third pad PE2a and a second surface that is in contact with the fourth pad PE2b. The second anisotropic conductive film 520 may bond the third pad PE2a of the flexible printed circuit board 200 and the fourth pad. PE2b of the printed circuit board (PCB) 300, and may electrically connect them at the same time.

Hereinafter, the anisotropic conductive film included in the display device according to an exemplary embodiment of the present invention will be described in detail with reference to FIG. 3. FIG. 3 illustrates an exploded perspective view showing an enlarged portion A of FIG. 1 according to an exemplary embodiment of the present inventive concepts.

Figure 3:
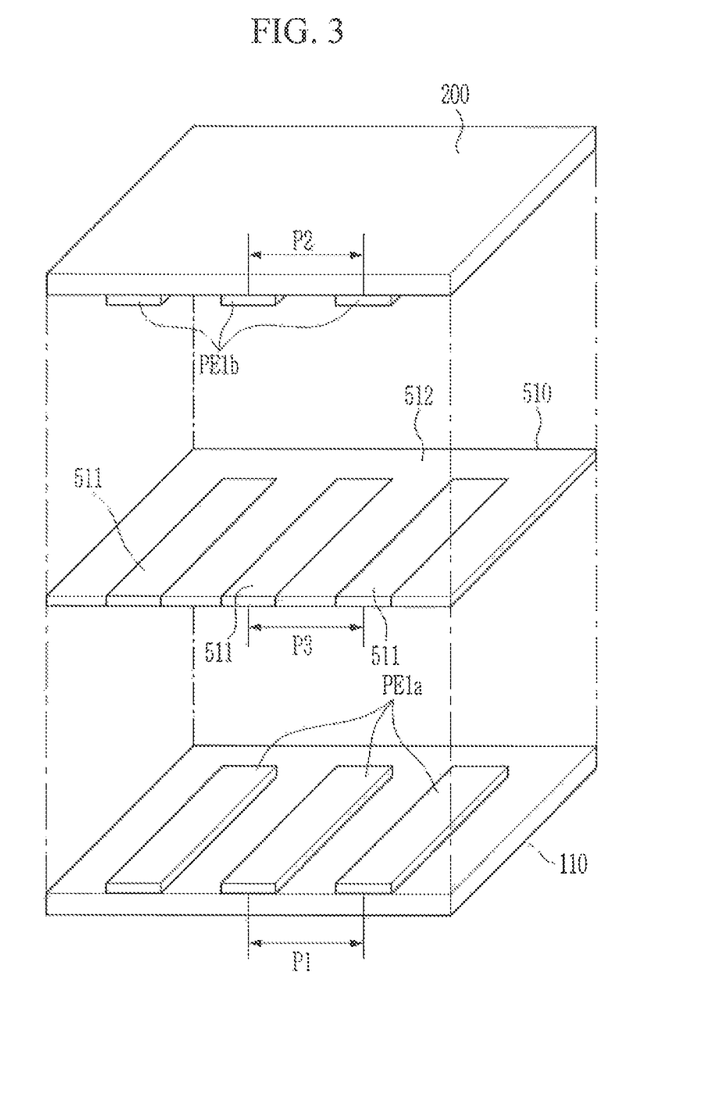
FIG. 3 illustrates an exploded perspective view showing an enlarged portion A of FIG. 1 according to an exemplary embodiment of the present inventive concepts.

As shown in the exemplary embodiment of FIG. 3, the first pad PE1a may be disposed on an upper surface of the substrate 110, and the second pad PE1b may be disposed on a lower surface of the flexible printed circuit board 200. The second pad PE1b may be disposed in a region overlapping the first pad PE1a. However, in exemplary embodiments, the first pad PE1a and the second pad PE1b may be completely aligned or may not be completely overlapped, may be offset to some extent, and may differ in size or shape. In addition, the first pad PE1a and the second pad PE1b may have various shapes such as a polygonal shape, a circular shape, and an elliptical shape. In the exemplary embodiment shown in FIG. 3, the first pad PE1a and second pad PE1b each comprise three rectangular pads that are spaced apart from each other. However, in alternative embodiments, the first pad PE1a and second pad PE1b may comprise different shapes and arrangements and may each include only a single pad.

The first anisotropic conductive film 510 may be disposed between the first pad PE1a and the second pad PE1b. The first anisotropic conductive film 510 may have a first surface that is in contact with the first pad PE1a and a second surface that is in contact with the second pad PE1b.

The first anisotropic conductive film 510 may include a conductive polymer. For example, in an exemplary embodiment, the first anisotropic conductive film 510 may include at least one of polyacetylene, polypyrrole, polythiophene, polyphenylene vinylene, and polyphenylene.

The first anisotropic conductive film 510 may include at least one conductive region 511 and at least one insulating region 512. The conductive region 511 is a region through which a current flows, and the insulating region 512 is a region where a current hardly flows. For example, the resistance of the conductive region 511 may exceed 0Ω and may be equal to or smaller than $10^5 Ω$, and the resistance of the isolating region 512 may be $10^6 Ω$ to $10^7 Ω$.

The conductive region 511 may be disposed in a region where the first pad PE1a and the second pad PE1b overlap each other. The conductive region 511 may electrically connect the first pad PE1a and the second pad PE1b which overlap each other. In addition, a plurality of conductive regions 511 in the first anisotropic conductive film 510 may be separately disposed and may be insulated from each other without being electrically connected to each other by the insulating region 512. For example, in the exemplary embodiment shown in FIG. 3, the conductive regions 511 are three rectangular regions that are spaced apart from each other and are substantially aligned with the first pad PE1a and second pad PE1b. However, the conductive regions 511 may have different shapes and arrangements and may only include a single region in some embodiments.

For example, the conductive regions 511 may have various shapes such as a polygonal shape, a circular shape, an elliptical shape, and the like. Although the conductive regions 511 are illustrated as being aligned with the first pad PE1a and the second pad PE1b in FIG. 3, they are not limited thereto, and the conductive regions 511 may not be completely aligned with the first pad PE1a and the second pad PE1b. For example, the conductive regions 511 may not completely overlap the first pad PE1a and the second pad PE1b and they may be slightly offset from each other. Each of the conductive regions 511 may overlap only one corresponding first pad PE1a and one corresponding second pad PE1b, and may not overlap another first pad PE1a or second pad PE1b.

The insulating region 512 may be disposed in a region where the first pad PE1a and the second pad PE1b do not overlap, and may be disposed in a region other than the conductive regions 511 to surround the conductive regions. The insulating region 512 may have different shapes and sizes. The insulating region 512 may include a single region or a plurality of regions that may be spaced apart from each other. In addition, the insulating region 512 may not overlap the first pad PE1a and the second pad PE1b. First pads PE1a disposed on the substrate 110 of the display panel may not be short-circuited to each other because of the insulating region 512 of the first anisotropic conductive film 510, and may not transfer electrical signals.

For example, when the first anisotropic conductive film 510 includes polyacetylene, the conducting region 511 may include trans-polyacetylene, and the insulating region 512 may include cis-polyacetylene. In this embodiment, the conductivity of the conductive region 511 is $10^{-4}$ S/cm to $10^{-2}$ S/cm, and the conductivity of the insulating region 512 is $10^{-8}$ S/cm to $10^{-6}$ S/cm. Accordingly, the conductive region 511 may transfer an electrical signal between the first pad PE1a and the second pad PE1b, and the electrical signal is cut off by the insulating region 512.

In the case of known prior devices having an anisotropic conductive film that includes conductive balls, the display panel and the flexible printed circuit board may be connected through a physical point contact by the conductive balls. In addition, the size of the conductive balls may not be infinitely small, and the conductive balls may have a certain size and volume and are disposed irregularly within the anisotropic conductive film. For example, the minimum size of the conductive balls may be about 3 μm.

A connection failure of the pad may occur due to the conductive ball characteristics described above. For example, when the conductive balls are excessively concentrated in some regions, the pads in the direction of a surface of the display panel may be short-circuited, and the display panel and the flexible printed circuit board may not be electrically connected to each other when the number of conductive balls is insufficient in some regions.

In addition, a pitch of the pad and an area of the pad may be limited to a certain size or more to permit electrical connection of the facing pads to each other by using conductive balls while simultaneously preventing the adjacent pads from being electrically connected. As a result, it is difficult to implement a high resolution display device, and there is a limitation in reducing a dead space in a high resolution display device. The dead space is a region other than the display area DA that displays an image in the display device, and may be the same region as the non-display area NA or a region including the non-display area NA.

However, in the anisotropic conductive film 510 according to an exemplary embodiment of the present inventive concepts, the first pad PE1a of the display panel and the second pad PE1b of the flexible printed circuit board 200 may be electrically connected to each other by including the conductive region 511 having high conductivity and the insulating region 512 having low conductivity without including the conductive balls. Therefore, defects and the limitations of the pitch and area of the pad due to the inclusion of the conductive balls are prevented. The pad may also include a fine pitch and area.

For example, the pitch P1 of the first pad PE1 and the pitch P2 of the second pad PE1b may be less than 27 μm. The pitch indicates a distance between the centers of the pads. Accordingly, the distance P3 between the centers of the conductive regions 511 of the first anisotropic conductive film 510 may be less than 27 μm.

Although only the first anisotropic conductive film 510 of FIG. 2 has been described in FIG. 3, the content of FIG. 3 may be similarly applied to the second anisotropic conductive film 520 connecting the third pad PE2a and the fourth pad PE2b of FIG. 2.

Figure 4:
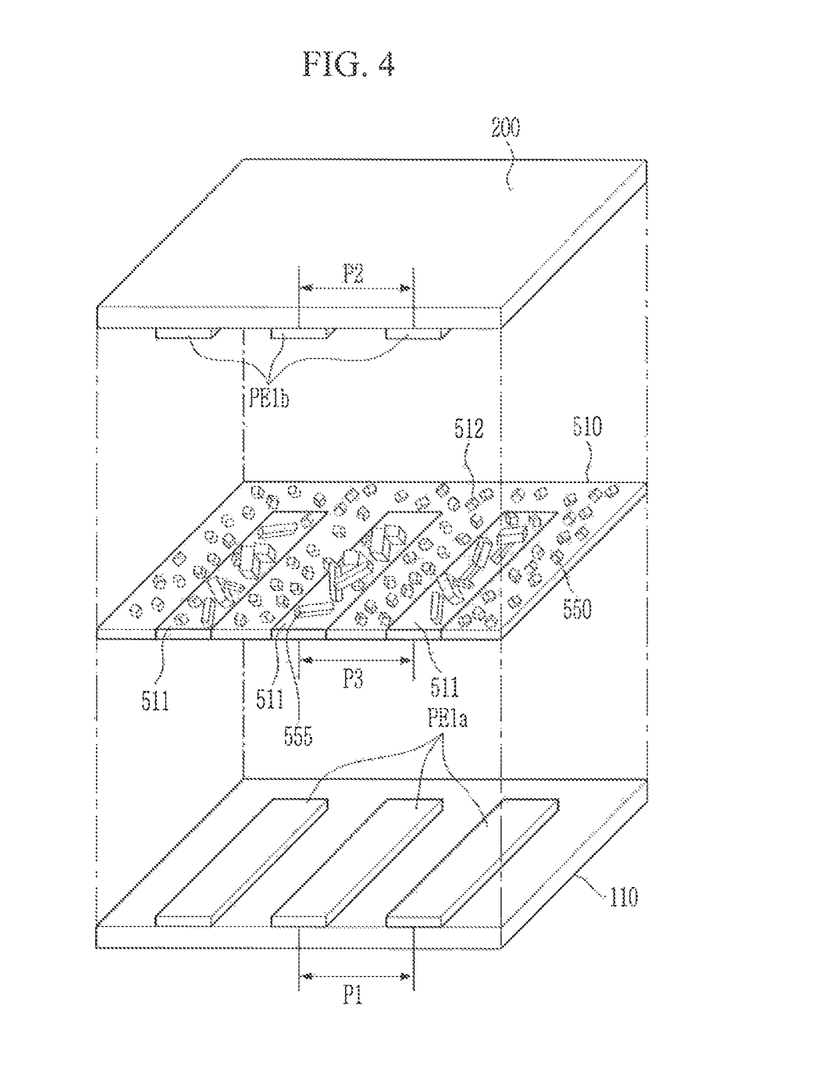
FIG. 4 illustrates an exploded perspective view of a display device according to an exemplary embodiment of the present inventive concepts.

Hereinafter, an anisotropic conductive film included in a display device according to an exemplary embodiment of the present invention will be described with reference to FIG. 4. FIG. 4 illustrates an exploded perspective view of a display device according to an exemplary embodiment of the present inventive concepts. FIG. 4 illustrates the same region as the region A of FIG. 1.

The first anisotropic conductive film 510 is similar to that of FIG. 3 except for the inclusion of silicon. Therefore, a detailed description of duplicate contents will be omitted.

The first anisotropic conductive film 510 may include a conductive region 511 and an insulating region 512. The conductive region 511 is a region through which a current flows, and the insulating region 512 is a region where a current hardly flows.

According to the present exemplary embodiment, the conductive region 511 of the first anisotropic conductive film 510 included in the display device may include a polysilicon 555. The insulating region 512 may include an amorphous silicon 550. The polysilicon 555 is an aggregate of the single crystal silicon region. The polysilicon 555 has an electron mobility of about 100 times higher than that of the amorphous silicon 550. The conductive region 511 of the first anisotropic conductive film 510 including the amorphous silicon 550 may be formed by selectively crystallizing the amorphous silicon into the polysilicon 555 using an excimer laser. The conductive region 511 may have an excellent electron mobility compared to that of the insulating region 512.

In an exemplary embodiment, the first anisotropic conductive film 510 may further include a resin. The resin may be a thermosetting resin or a photocurable resin. For example, the resin may be an epoxy resin, an acrylic resin, a polyester resin, a bismaleimide resin, or a cyanate resin. When the first anisotropic conductive film 510 includes a resin, the electron mobility may be lower than when the first anisotropic conductive film 510 does not include a resin. The electron mobility of the first anisotropic conductive film 510 may be controlled by adjusting the density of the silicon particles contained in the resin.

The first pad PE1a disposed on an upper surface of the substrate 110 and the second pad PE1b disposed on a lower surface of the flexible printed circuit board 200 may be bonded to the conductive region 511 of the first anisotropic conductive film 510 for electrical connection to each other. The pitch P1 of the first pad PE1 and the pitch P2 of the second pad PE1b may be less than 27 μm. Accordingly, the distance P3 between the centers of the conductive regions 511 of the first anisotropic conductive film 510 may be less than 27 μm.

Although only the first anisotropic conductive film 510 of FIG. 2 has been described in FIG. 4, the features shown in the exemplary embodiment of FIG. 4 may be similarly applied to the second anisotropic conductive film 520.

Figure 5:
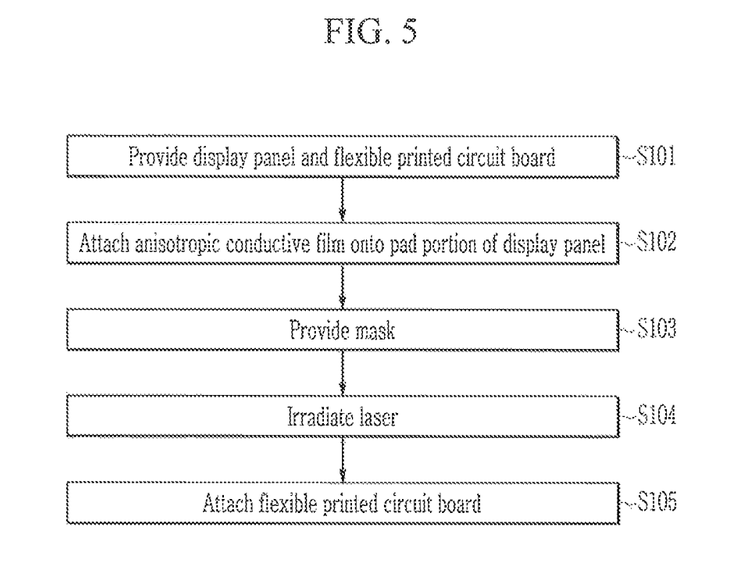
FIG. 5 is a flowchart illustrating a manufacturing method of a display device according to an exemplary embodiment of the present inventive concepts.

A manufacturing method of a display device according to an exemplary embodiment will now be described with reference to FIG. 5. Specifically, a method for attaching a flexible printed circuit board to a display panel included in a display device using an anisotropic conductive film will be described. FIG. 5 is a flowchart illustrating a manufacturing method of a display device according to an exemplary embodiment.

A display panel having pads and a flexible printed circuit board may be prepared (S101), The pads of the display panel and the pads of the flexible printed circuit board may be formed at positions to overlap each other.

An anisotropic conductive film may be attached to the pad portion of the display panel (S102). The anisotropic conductive film may be a film including a conductive polymer. For example, the anisotropic conductive film may include at least one of polyacetylene, polypyrrole, polythiophene, polyphenylene vinylene, and polyphenylene.

A mask may be prepared on the anisotropic conductive film (S103). The mask may be used to selectively and locally irradiate a laser to a predetermined region of the anisotropic conductive film. The mask may be disposed on the anisotropic conductive film, and may include an opening in an area corresponding to the pads of the display panel. Accordingly, the laser may be locally irradiated only in an area where the anisotropic conductive film overlaps the pads of the display panel. Particularly, it is easy to perform the alignment of a pad region by using a mask, which permits the laser to be accurately irradiated to the region corresponding to the pads having a fine pitch. Accordingly, it is possible to form a pad having a fine pitch and area, and it is possible to manufacture a display device of high resolution and high integration.

A laser may be irradiated to the anisotropic conductive film (S104). The irradiating of the laser may be performed by irradiating the laser only to the region where the anisotropic conductive film overlaps the pads of the display panel.

The bonding of the conductive polymer may be deformed to increase the conductivity in the region to which the laser is irradiated. For example, the anisotropic conductive film attached to the display panel may be a film including cis-polyacetylene in step S102, which attaches the anisotropic conductive film to the pad portion of the display panel. When heat of about 180° C. is applied to the cis-polyacetylene, the bonding is deformed to form a trans-polyacetylene having a geometric isomer relationship. Therefore, when a laser is irradiated to a film including cis-polyacetylene, trans-polyacetylene is formed in the region to which the laser is irradiated. In other words, the region to which the laser is irradiated includes trans-polyacetylene, and a region to which the laser is not irradiated includes cis-polyacetylene.

The conductivity of trans-polyacetylene is higher than that of cis-polyacetylene. For example, the conductivity of trans-polyacetylene is $10^{-4}$ S/cm to $10^{-2}$ S/cm, and the conductivity of cis-polyacetylene is $10^{-8}$ S/cm to $10^{-6}$ S/cm. Therefore, the region to which the laser is irradiated may serve as the conductive region that transmits an electrical signal, and the other region may serve as the insulating region which does not transmit the electrical signal.

Although the anisotropic conductive film is described as including a conductive polymer, the anisotropic conductive film may include silicon particles. In this embodiment, amorphous silicon may be crystallized into polysilicon by irradiating an excimer laser to an anisotropic conductive film including amorphous silicon. The electron mobility of the polysilicon is about 100 times higher than that of the amorphous silicon. Accordingly, the region that includes polysilicon by irradiating the laser thereto may serve as the conductive region, and the region including the amorphous silicon may serve as the insulating region.

A flexible printed circuit board may be attached to the anisotropic conductive film (S105). For example, the pads of the flexible printed circuit board may overlap a region of the anisotropic conductive film to which the laser is irradiated. The pads of the display panel, the pads of the flexible printed circuit board, and the conductive region of the anisotropic conductive film to which the laser is irradiated may overlap for electrical connection thereto as previously described. In addition, the pads that are adjacent to each other in a planar direction may be insulated from each other by the insulating region of the anisotropic conductive film.

Figure 6:
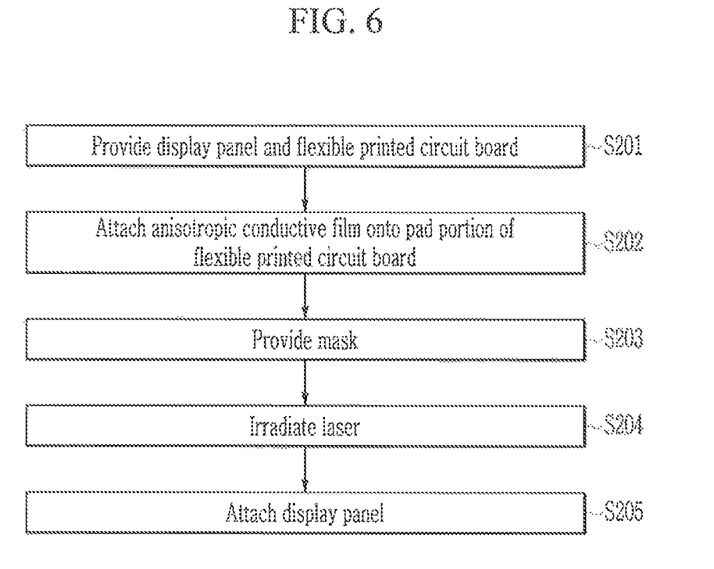
FIG. 6 is a flowchart illustrating a manufacturing method of a display device according to an exemplary embodiment of the present inventive concepts.

A manufacturing method of a display device according to another exemplary embodiment of the present inventive concepts will now be described with reference to FIG. 6. FIG. 6 is a flowchart illustrating a manufacturing method of a display device according to an exemplary embodiment. The manufacturing method of FIG. 6 is similar to that of FIG. 5 and the detailed description of the redundant constituent elements will be omitted.

A display panel having pads and a flexible printed circuit board may be prepared (S201). An anisotropic conductive film may be attached to the pad portion of the flexible printed circuit board. The anisotropic conductive film may be a film including a conductive polymer, or may include silicon particles.

A mask is provided on the anisotropic conductive film (S203). A laser may be irradiated onto the anisotropic conductive film (S204). The irradiating of the laser may be performed by irradiating the laser only to the region where the anisotropic conductive film overlaps the pads of the flexible printed circuit board using a mask.

Next, the display panel may be attached to the anisotropic conductive film (S205). In this embodiment, the pads of the display panel overlap the region of the anisotropic conductive film to which the laser is irradiated.

The methods described herein may further include the steps of attaching a second anisotropic conductive film to a second pad portion of the flexible printed circuit board or a printed circuit board in a similar manner as previously described with respect to the first anisotropic conductive film. A mask may be prepared on the second anisotropic conductive film to form at least one conductive region and at least one insulating region as previously described with respect to the first anisotropic conductive film. The second anisotropic conductive film bonds and electrically connects the second pad portion of the flexible circuit board to the printed circuit board.

While the exemplary embodiments of the present inventive concepts have been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A display device comprising:
a display panel;
a flexible primed circuit board electrically connected to the display panel a first pad disposed on the display panel;
a second pad disposed on the flexible printed circuit board and overlapping the first pad; and
a first anisotropic conductive film disposed between the first pad and the second pad, the first anisotropic conductive film configured to bond the first pad to the second pad;
wherein the first anisotropic conductive film includes a conductive polymer, and
the first anisotropic conductive film includes a first conductive region that is configured to electrically connect the first pad and the second pad and a first insulating region, and
wherein the first conductive region includes trans-polyacetylene, and
the first insulating, region includes cis-polyacetylene.

2. The display device of claim 1, wherein
the first conductive region is disposed in a region where the first pad and the second pad overlap, and
the first insulating, region is disposed in a region surrounding the first conductive region.

3. The display device of claim 2, wherein
the conductive polymer includes at least one among polyacetylene, polypyrrole, polythiophene, polyphenylene vinylene, and polyphenylene.

4. The display device of claim 2, wherein
a pitch of the first pad is 27 μm or less.

5. The display device of claim 2, further comprising:
a printed circuit board;
a third pad disposed on the flexible printed circuit board; and
a fourth pad disposed on the printed circuit board.

6. The display device of claim 5, further comprising
a second anisotropic conductive film disposed between the third pad and the fourth pad, the second anisotropic conductive film configured to bond the third pad to the fourth pad.

7. The display device of claim 6, wherein
the second anisotropic conductive film includes a conductive polymer.

8. The display device of claim 7, wherein
the second anisotropic conductive film includes a second conductive region configured to electrically connect the third pad and the fourth pad and a second insulating region, and
the second conductive region is disposed in region where the third pad and the fourth pad overlap.

9. The display device of claim 8, wherein
the flexible printed circuit board includes a data driver integrated circuit.

10. The display device of claim 9, wherein
the data driver integrated circuit is configured to transmit a signal to the display panel through the second pad, the first anisotropic conductive film, and the first pad.

11. A display device comprising:
a display panel;
a flexible printed circuit board electrically connected to the display panel;
a first pad disposed on the display panel;
a second pad disposed on the flexible printed circuit board and overlapping the first pad; and
a first anisotropic conductive film disposed between the first pad and the second pad, the first anisotropic conductive film configured to bond the first pad to the second pad,
wherein the first anisotropic conductive film includes a first conductive region configured to electrically connect the first pad to the second pad and a first insulating region,
the first conductive region includes a polysilicon, and
the first insulating region includes an amorphous silicon.

12. The display device of claim 11, wherein
the first conductive region is disposed in a region where the first pad and the second pad overlap, and
the first insulating region is disposed in a region surrounding the first conductive region.

13. The display device of claim 12, wherein
the first anisotropic conductive film further includes a thermosetting resin or a photocurable resin.

14. The display device of claim 13, further comprising:
a printed circuit board;
a third pad disposed on the flexible printed circuit board;
a fourth pad disposed on the printed circuit board; and
a second anisotropic conductive film disposed between the third pad and the fourth pad.

15. The display device of claim 14, wherein
the second anisotropic conductive film includes a second conductive region that is configured to electrically connect the third pad to the fourth pad and a second insulating region,
the second conductive region includes a polysilicon, and
the second insulating region includes an amorphous silicon.

16. The display device of claim 15, wherein
the second anisotropic conductive film further includes a thermosetting resin or a photocurable resin.

17. A manufacturing method of a display device, the method comprising:
provide a display panel and a flexible printed circuit board;
attaching an anisotropic conductive film to the display panel or the flexible printed circuit board;
providing a mask on the anisotropic conductive film, wherein the mask includes an opening in an area corresponding to a pad of the display panel or a pad of the flexible printed circuit board; and
irradiating a laser onto the anisotropic conductive film through the opening of the mask onto a region of the anisotropic conductive film that overlaps the pad of the display panel or the pad of the flexible printed circuit board, the laser increases a conductivity of the anisotropic conductive film to form a conductive region in a region that was irradiated by the laser and an insulating region in a region that was not irradiated by the laser.

18. The manufacturing method of claim 17, wherein
the anisotropic conductive film includes a conductive polymer.

19. The manufacturing method of claim 17, wherein
the region of the anisotropic conductive film to which the laser is irradiated includes a polysilicon, and
the region of the anisotropic conductive film to which the laser is not irradiated includes an amorphous silicon.

\* \* \* \* \*